… … 10/28/85    OR    4,620,081

United States Patent [19]
Zeren

[11] Patent Number: 4,620,081
[45] Date of Patent: Oct. 28, 1986

[54] SELF-CONTAINED HOT-HOLLOW CATHODE GUN SOURCE ASSEMBLY

[75] Inventor: Joseph D. Zeren, Boulder, Colo.

[73] Assignee: The United States of America as represented by the United States Department of Energy, Washington, D.C.

[21] Appl. No.: 637,628

[22] Filed: Aug. 3, 1984

[51] Int. Cl.⁴ .............................................. B23K 9/00
[52] U.S. Cl. ............................. 219/121 EE; 204/298; 118/726; 219/121 EF
[58] Field of Search ......................... 204/298, 192 R; 118/715, 723, 726, 727; 219/121 EE, 121 EF, 121 EG, 275

[56]         References Cited
         U.S. PATENT DOCUMENTS

| | | | |
|---|---|---|---|
| 3,132,198 | 5/1964 | Du Bois et al. | 219/121 EF |
| 3,234,606 | 2/1966 | Smith, Jr. | 219/121 EF |
| 3,267,015 | 8/1966 | Morley | 204/192 |
| 3,409,729 | 11/1968 | Hanks et al. | 219/121 EF |
| 3,483,417 | 12/1969 | Hanks et al. | 219/121 EF |
| 3,554,512 | 1/1971 | Elliott et al. | 118/726 X |
| 3,562,141 | 2/1971 | Morley | 204/298 |
| 3,710,072 | 1/1973 | Shrader et al. | 219/121 EF |
| 3,984,088 | 10/1976 | Sommerkamp | 118/726 X |
| 4,115,653 | 9/1978 | Kienel et al. | 118/726 X |
| 4,303,694 | 12/1981 | Bois | 118/726 X |

OTHER PUBLICATIONS

J. Luce, "Intense Gaseous Discharges", Proceedings of Second U.N. Conference on Peaceful Use of Atomic Energy (1958) 31, 305.
Lidsky et al., "Highly Ionized Hollow Cathode Discharge", J. of Applied Physics, vol. 33, #8, 8/1962, pp. 2490–2497.
Morley, "The Hollow Cathode Discharge", Proceedings of the 5th Annual Meeting of the Electron Symposium, 3/1963.
Wan et al., "Investigation of Hot-Filament and Hollow-Cathode Electron Beam Techniques for Ion Plating", J. of Vac. Science and Technology, vol. 8, #6, 1971, p. 99.
D. Williams, "Vacuum Coating With A Hollow Cathode Source", J. Vac. Sci. Technol., vol. 11, #1, Jan.-/Feb. 1974, pp. 374–376.
G. Mah, "PVD by Electron Beam Processes", 1983, Plating and Surface Finishing Journal of Amer. Electroplater's Society.

Primary Examiner—John F. Niebling
Assistant Examiner—Nam X. Nguyen
Attorney, Agent, or Firm—George H. Libman; Albert Sopp; Judson R. Hightower

[57]         ABSTRACT

A self-contained hot-hollow cathode gun source assembly for use in a vacuum chamber includes a crucible block having a hot-hollow cathode gun mounted underneath and providing a hole for the magnetic deflection of the ion/electron beam into a crucible on top the block.

9 Claims, 3 Drawing Figures

SELF-CONTAINED HOT-HOLLOW CATHODE GUN SOURCE ASSEMBLY

The U.S. Government has rights in this invention pursuant to Contract No. DE-AC04-76DP03533 between the Department of Energy and Rockwell International.

BACKGROUND OF THE INVENTION

The present invention relates generally to a vacuum vapor deposition source assembly, and more particularly to a hot-hollow cathode gun source assembly with improved flexibility.

This application is related to the inventor's co-pending patent application Ser. No. 554,414 filed Nov. 22, 1983.

Physical vapor deposition by electron beam evaporation is well known as a method of manufacturing corrosion and oxidation resistant coatings, magnetic coatings, optical coatings, structural and electrically resistive elements, and coatings for subsequent diffusion bonding. Most commercially available electron beam evaporation sources apply several thousand volts at approximately one ampere to a filament cathode to develop the electron beam. However, another source for electron beam evaporation is the hot-hollow cathode, which source generates electrons from an applied voltage of approximately 25 volts and a current on the order of 250 amperes.

The differences inherent in these electron sources causes the electrons produced by each of them to have different current-density and kinetic energy. Only the electrons from the hot-hollow cathode have the desirable density and kinetic energy to ionize the evaporant atoms. These ions may then be used to sputter-clean the substrate prior to deposition, resulting in an excellent adhesion between the coating and substrate. In addition, the hot-hollow cathode has the advantage of high adhesion at a lower substrate temperature than does the filament cathode, eliminating substrate distortion.

Electron beam deposition occurs in a vacuum chamber containing a source, a crucible of material to be deposited, and a substrate upon which the material will be deposited.

Prior hot-hollow cathode installations did not provide for relative movement of gun and crucible; the crucible to substrate distance could only be changed by moving the substrate holding fixture. The radial distance between the crucible and the substrate center line could not be changed, a factor severely limiting the flexibility of a given installation where many different substrates are to be coated.

The inventor's related invention of Ser. No. 554,414 solved many of these problems by permitting movement of the cathode assembly through a hole in the bottom of the vacuum chamber. While this system permitted access to utility supply lines in a nonvacuum environment, and also kept the supply voltage away from conditions within the chamber susceptible to arcing, movement of the gun within the chamber remains limited by the position of the hole and the vertical travel of the assembly.

SUMMARY OF THE INVENTION

It is an object of this invention to provide a hot-hollow cathode gun assembly which may be moved within a vacuum chamber.

It is another object of this invention to provide a self-contained hot-hollow cathode gun assembly which can be placed at any position within any vacuum chamber.

Additional objects, advantages and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the hot-hollow cathode gun source assembly of this invention may comprise a crucible block having a crucible on an upper surface and a hole near a front portion. First and second pole plates are affixed to each side of the crucible block, each plate having an upper edge adjacent to the upper side of the block and a lower edge extending below the lower side of the block. A hot-hollow cathode gun having an output end for releasing an ion/electron beam and an opposed input end for receiving gas and electricity is mounted underneath the lower side of the block with the output end adjacent the hole. A deflection magnet is connected between the pole plates to deflect the output beam of the gun through the hole and into the crucible.

BRIEF DESCRIPTION OF THE DRAWINGS

The accompanying drawings, which are incorporated in and form a part of the specification, illustrate an embodiment of the present invention, and together with the description, serve to explain the principles of the invention.

DETAILED DESCRIPTION OF THE INVENTION

Figure 1:
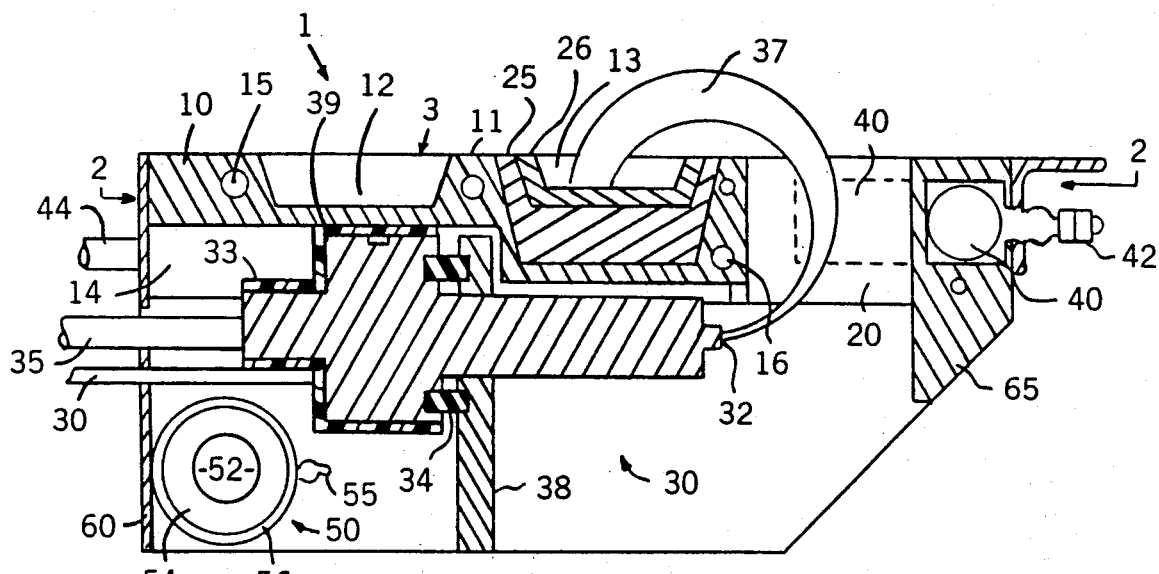
FIG. 1 is a sectional side view of the invention.

As shown in the figures, a self-contained hot-hollow cathode gun source assembly 1 includes a crucible block 10, spaced and opposed left and right pole plates 3 and 4, a hot-hollow cathode gun 30, a gun support plate 38, a beam deflection magnet 50 and a horizontal beam deflection magnet 40. This assembly can be used in any vacuum deposition chamber of the type shown and disclosed in related patent application Ser. No. 554,414. Since this vacuum chamber is not a part of the present invention, no further discussion of this prior art device is provided in this description.

Crucible block 10 is preferably machined from a mass of copper and includes an upper surface 11 having two detent portions defining a rearward crucible holder 12 and a forward crucible holder 13. Crucible block 10 also has a lower surface 14, including a semi-cylindrical cut-out portion sized to receive gun 30, left and right sides 21 and 22, respectively, and front and rear portions 23 and 24, respectively. A hole 20 extends between upper surface 11 and lower surface 14 adjacent front portion 23.

Figure 2:
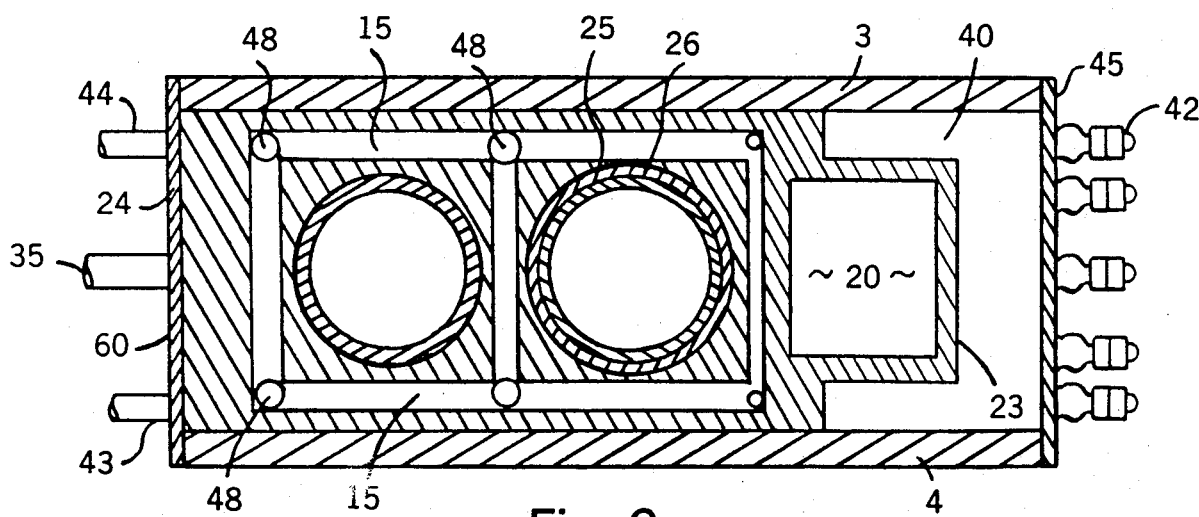
FIG. 2 is a sectional top view taken along 2—2 of FIG. 1. of the invention.

Crucible block 10 is also provided with a plurality of coolant channels through which a coolant such as water may be circulated. The coolant system includes upper and lower coolant channels 15 and 16 connected by a plurality of interconnecting vertical channels 48 (FIG. 2). An input line 44 connects to one side of lower coolant channel 16, and an output line 43 to the other side of channel 16.

Figure 3:
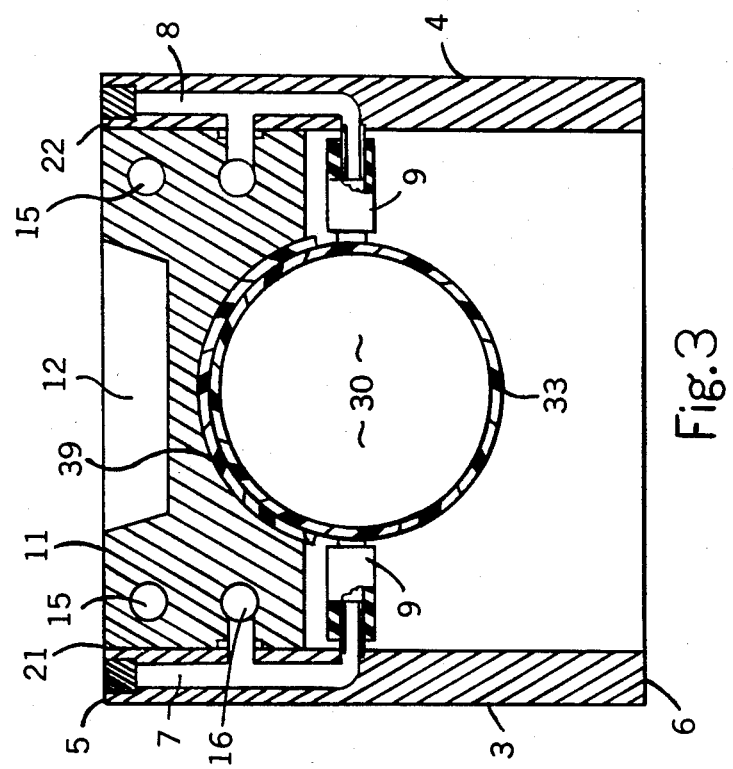
FIG. 3 is a sectional rear view taken along 3—3 of FIG. 1. of the invention.

Pole plates 3 and 4 provide magnetic control of the beam, as discussed hereinafter, and form an exterior shell for assembly 1. As shown in the figures, left pole plate 3 is affixed to side 21 and right pole plate 4 to side 22 of crucible block 10. Each pole plate has an upper edge 5 generally adjacent upper surface 11 of crucible block 10, and a lower edge 6 extending below lower surface 14. Lower edges 6 of the pole plates serve as a supporting surface for assembly 1. As shown in FIG. 3, pole plate 3 includes a coolant channel 7 and pole plate 4 includes a coolant channel 8. Each of channels 7 and 8 are connected to lower coolant channels 16, and through couplings 9, to coolant channels (not shown) in gun 30 to provide for circulation of coolant through plates 3, 4 and gun 30.

An easy method of constructing the coolant channels of this invention is also shown in FIG. 3, where each channel is seen to be drilled from a surface (such as upper edge 5) and plugged by plug 17 to prevent escape of coolant from the system.

Nonmagnetic gun support plate 38 is connected between pole plates 3 and 4. Extending generally perpendicular to lower surface 14, gun support plate 38 approximately bisects the volume between pole plates 3, 4. A hole (not shown) in gun support plate 38 is provided for barrel 31 of hot-hollow cathode gun 30. The portion of gun 30 beneath the rear portion of crucible block 10 includes the input electric current supply 36 and gas supply 35. An insulator ring 34 provides electrical insulation between gun 30 and gun support plate 38. The output end 32 of gun 30 is mounted adjacent hole 20 of crucible block 10.

Assembly 1 further includes a beam deflection magnet 50 including a magnet core 52 surrounded by windings 54, a hermetically sealed shell 56 and sealed electrical pass-throughs 55. Magnet core 52 extends from plate 3 to plate 4 and is mounted beneath and behind the input end of cathode gun 30.

A nonmagnetic back plate 60 extends from rear portion 24 of crucible block 10 along the rear edges of plates 3, 4 to form an enclosure for magnet 50 and the input portion of gun 30. Suitable openings are provided in plate 60 for the passage of supply lines to gun 30 and electromagnet 50 and for coolant lines 44, 43.

A safety block 65 is preferably mounted in line with output 32 of gun 30 across the front of assembly 1. Safety block 65 serves to block the output of gun 30 in case of a power failure to the steering magnets, thereby preventing damage to the chamber in which assembly 1 is being used.

Horizontal beam deflection magnet 40 is a commercially available U-shaped magnet which fits over block 65 around hole 20 at the front portion 23 of crucible block 10. Electrical signals may be applied to terminals 42 of magnet 40 to cause the beam output of gun 30 to be deflected as discussed hereinafter. A nonmagnetic L-shaped shield 45 shields the magnet terminals 42 from vaporized material emitted from the crucible.

The structure of assembly 1 may also include a crucible insert spacer 25 tightly fitting in forward crucible holder 13. The cavities themselves can serve as crucibles for holding some materials during vaporization. However, a crucible 26 fabricated from special materials such as tantalum for a specific application is preferably placed in these cavities. Crucible 26 would typically contain a plating material such as silver, gold, aluminum, etc.

Hot-hollow cathode gun 30 is not shown in detail as its construction is not part of this invention. However, this conventional hot-hollow cathode gun may include a stainless steel tube with a tantalum tip through which small quantities of argon or other gas flow into the vacuum chamber. A liquid-cooled, electrically-isolated, stainless steel shield surrounds the tube to reduce the occurrence of unwanted arcing around the outside of the gun. Cooling is provided through connections 9, as discussed above. The gun may be held against plate 38 through insulating ring 34 by any conventional means such as an insulated screw (not shown). The portion of gun 30 behind plate 38 is surrounded by a dielectric, nonoutgassing shield 33. An additional dielectric shield 39 spaces gun 30 from lower surface 14 of block 10. Additional details on the construction of such a gun may be found in an article by Duane/Williams, "Vacuum Coating With a Hollow cathode Source", J. Vac. Sci. Technol. Volume 11, #1, January/February 1974, whichis herein incorporated by reference.

Crucible block 10 and crucible spacer inserts 25 may advantageously be made out of oxygen-free, high conductivity O.F.H.C. copper. The magnet pole plates 3, 4 and magnet core 52 may be constructed from soft iron or steel. Gun support plate 38, back plate 60 and shield 45 are constructed of non magnetic stainless steel or other nonmagnetic material. Horizontal deflection magnet 40 may advantageously be a commercially available electromagnet assembly supplied by Airco Temescal of Berkeley, Calif., Model Number 0303-9433-0, a device conventionally used for the deflection of electron beams. Safety block 65 may be a high thermal conductive nonmagnetic metal such as copper and dielectric shields 33 and 39 may be a synthetic resin polymer such as Teflon or Vespel SP1.

In operation, coolant fluid is circulated into line 44 and out of line 43 through crucible block 10 and gun 30, and a deposition material such as silver is placed in crucible 26 on holder 25. Gas and electricity is provided to hot-hollow cathod gun 30, causing an iron/electron beam 37 output therefrom. Magnet 50 is energized to steer beam 37 through hole 20 of block 10 into crucible 25. The position of beam 37 on the surface of the deposition material may be controlled between front and rear surfaces of block 10 into either crucible by magnet 50. The position between plates 3 and 4 may be controlled and oscillated by magnet 42.

Assembly 1 may be placed anywhere within a vacuum chamber, as long as the location may be serviced by supply lines passing through the chamber wall. This structure permits maximum flexibility in research applications for determining the best placement of assembly 1 to maximize efficiency and operation of the deposition process. The unique dielectric nonoutgassing shield 33 of the input end of gun minimizes unwanted effects of arcing from the input voltage.

The particular sizes and equipment discussed above are cited merely to illustrate a particular embodiment of the invention. It is contemplated that the use of this invention may involve components having different sizes and shapes as long as the principle, using a hot-hollow cathode source which is movable within a vacuum chamber, is followed. A system so constructed will provide a useful, convenient system for deposition on a substrate. It is intended that the scope of the invention be defined by the claims appended hereto.

I claim:

1. A self-contained hot-hollow cathode gun source assembly, for use in a vacuum chamber, comprising:
   a crucible block having opposed and spaced upper and lower surfaces, first and second sides, front and rear portions, a coolant channel for conducting a coolant through said block, coolant input means for supplying a coolant to said channel, and coolant output means for removing a coolant from said channel;
   said upper surface including means for holding a deposition material, and
   a hole extending between said upper and lower surfaces, said hole being adjacent said front portion, said means for holding being between said hole and said rear portion;
   first and second pole plates affixed to said first and second sides, respectively, of said block, each of said plates including:
      an upper edge adjacent said upper surface of said block;
      a lower edge extending below said lower surface of said block; and
      a plate coolant channel connected at one end to said block coolant channel and at an opposite end to one end, respectively, of first and second tubular dielectric connectors;
   a hot-hollow cathode gun having a tubular output end including a tip for releasing an ion/electron beam, an opposed input end including means for supplying gas and means for supplying electricity to said gun, and a coolant channel for conducting a coolant through said gun;
   the other end of each of said dielectric connectors being connected to said gun coolant channel, whereby coolant circulates from said input means through said block and said gun to said output means;
   means for mounting said gun between said pole plates adjacent said lower surface of said block, said means for mounting comprising a gun support plate extending between said pole plates and having an upper edge adjacent said lower surface of said block, said gun output end protruding through a hole in said support plate, said tip being adjacent said hole;
   a dielectric shield surrounding said gun input end, whereby electrical discharge between said input end of said gun and said pole plates, said support plate and said lower surface is prevented; and
   deflection magnet means connected between said pole plates for deflecting the beam from said tip through said hole to said means for holding a deposition material.

2. The gun source assembly of claim 1 further comprising a back plate extending from rear portion of said block to said lower edge of each pole plate, said back plate having a hole for said means for supplying gas and means for supplying electricity to said gun.

3. The gun source assembly of claim 2 wherein said deflection magnet means is located between said back plate and said gun support plate and below said gun.

4. The gun source assembly of claim 1 wherein said means for holding a deposition material comprises a crucible and an indented portion in said upper surface surrounded by said block coolant channels, said crucible having a bottom sized to tightly fit within said indented portion of said block.

5. The gun source assembly of claim 1 wherein said deflection magnet means is capable of steering said ion beam along said upper surface between said front and rear portions, said assembly further comprising x-y deflection magnet means for steering said beam along said upper surface between said pole plates.

6. The gun source assembly of claim 5 further comprising a safety block mounted adjacent said lower surface of said crucible block, said safety block being aligned with said tip and spaced therefrom by said hole in said crucible block, whereby the beam from said gun will strike said safety block if the deflection magnet means fails.

7. The gun source assembly of claim 6 wherein said safety block is made of copper.

8. The gun source assembly of claim 1 herein said crucible block is made of copper and said pole plates are made of iron.

9. The gun source assembly of claim 1 wherein said crucible block is made of copper, said pole plates are made of iron, and said gun support plate and back plate are made of stainless steel.

* * * * *